(12) United States Patent
Kanno et al.

(10) Patent No.: US 9,281,345 B2
(45) Date of Patent: Mar. 8, 2016

(54) RESISTANCE CHANGE TYPE MEMORY DEVICE WITH THREE-DIMENSIONAL STRUCTURE

(71) Applicant: Kabushiki Kaisha Toshiba, Minato-ku (JP)

(72) Inventors: Hiroshi Kanno, Mie-ken (JP); Yoichi Minemura, Mie-ken (JP); Takayuki Tsukamoto, Mie-ken (JP); Takamasa Okawa, Mie-ken (JP); Atsushi Yoshida, Mie-ken (JP); Hideyuki Tabata, Mie-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 67 days.

(21) Appl. No.: 14/107,442

(22) Filed: Dec. 16, 2013

(65) Prior Publication Data

US 2015/0014622 A1  Jan. 15, 2015

Related U.S. Application Data

(60) Provisional application No. 61/844,234, filed on Jul. 9, 2013.

(51) Int. Cl.
  *H01L 29/02*  (2006.01)
  *H01L 27/24*  (2006.01)
  *H01L 45/00*  (2006.01)

(52) U.S. Cl.
  CPC .......... *H01L 27/2436* (2013.01); *H01L 27/249* (2013.01); *H01L 45/10* (2013.01); *H01L 45/1226* (2013.01); *H01L 45/14* (2013.01); *H01L 45/145* (2013.01); *H01L 45/16* (2013.01); *H01L 45/1616* (2013.01); *H01L 45/1675* (2013.01)

(58) Field of Classification Search
  CPC .......... H01L 45/04; H01L 29/00; H01L 27/24; G11C 13/0004
  USPC ................... 257/2–5, E29.002; 438/102–104
  See application file for complete search history.

(56) References Cited

U.S. PATENT DOCUMENTS 5,565,708 A * 10/1996 Ohsaki et al. ................. 257/764
6,611,010 B2     8/2003 Goda et al.
(Continued)

FOREIGN PATENT DOCUMENTS

TW       201209827 A1    3/2012

OTHER PUBLICATIONS

Office Action issued Jul. 15, 2015 in Taiwanese Patent Application No. 102146998 (with English language translation).

*Primary Examiner* — Jami M Valentine
(74) *Attorney, Agent, or Firm* — Oblon, McClelland, Maier & Neustadt, L.L.P.

(57) ABSTRACT

According to an embodiment, a non-volatile memory device includes a first wiring extending in a first direction, a second wiring extending in a second direction orthogonal to the first direction. The device includes third wirings, and a first and a second memory. The third wirings extend in a third direction crossing the first direction and orthogonal to the second direction, and aligned in the second direction on both sides of the second wiring. The first memory is provided between one of third wiring pair and the second wiring, the pair of third wirings facing each other across the second wiring. The second memory is provided between another one of the third wiring pair and the second wiring. The second wiring has a block portion between a first portion in contact with the first memory and a second portion in contact with the second memory.

16 Claims, 15 Drawing Sheets

(56) References Cited

U.S. PATENT DOCUMENTS

| | | | |
|---|---|---|---|
| 7,205,590 B2 * | 4/2007 | Fukuzumi | 257/211 |
| 7,227,171 B2 * | 6/2007 | Bez et al. | 257/3 |
| 8,357,613 B2 | 1/2013 | Choi et al. | |
| 8,450,713 B2 | 5/2013 | Awaya et al. | |
| 2010/0219392 A1 * | 9/2010 | Awaya et al. | 257/3 |
| 2011/0149656 A1 | 6/2011 | Tang et al. | |
| 2012/0112156 A1 | 5/2012 | Park et al. | |

* cited by examiner

RESISTANCE CHANGE TYPE MEMORY DEVICE WITH THREE-DIMENSIONAL STRUCTURE

CROSS-REFERENCE TO RELATED APPLICATIONS

This application is based upon and claims the benefit of priority from U.S. Provisional Patent Application 61/844,234, filed on Jul. 9, 2013; the entire contents of which are incorporated herein by reference.

FIELD

Embodiments are generally related to a non-volatile memory device.

BACKGROUND

A memory cell array having a three-dimensional structure has been studied for realizing next-generation non-volatile memory devices. For example, such a memory cell array may include bit lines extending in the direction perpendicular to an underlayer, and memory cells are disposed along each bit line. The memory cells may include a storage layer provided on the sidewall of the bit line.

It is possible to increase the memory capacity so as to provide the memory cells on both side of the bit line. However, when a pair of memory cells are disposed facing each other across the bit line, and one of the memory cells is selected for storing or erasing data, such an operation may influence the other memory cell. That is, a phenomenon so called "disturb" may induce an operational error, and reduces the reliability of the memory device.

DETAILED DESCRIPTION

Figure 1:
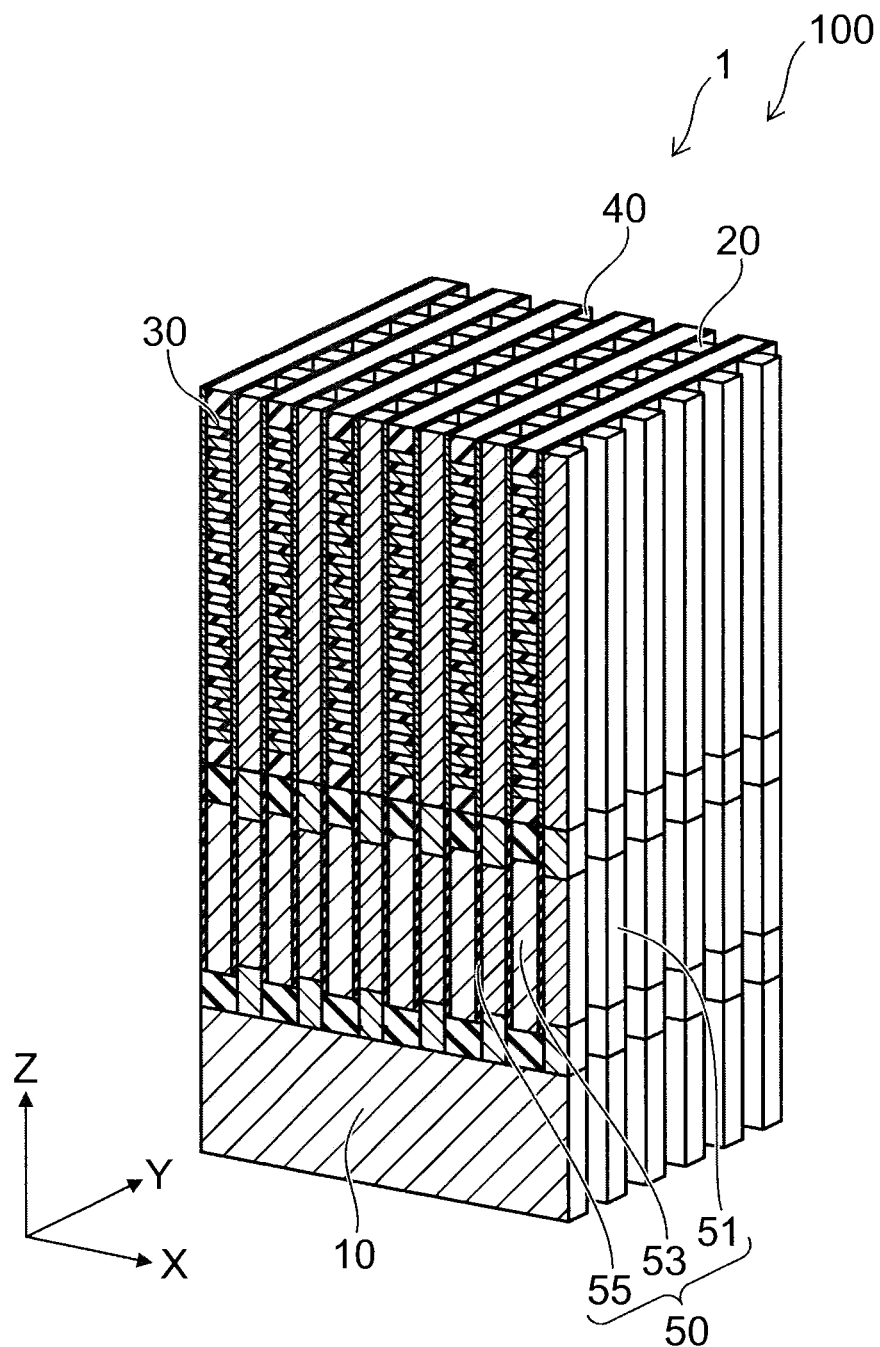
FIG. 1 is a schematic perspective view showing an example of a memory cell array of a non-volatile memory device according to a first embodiment.

According to an embodiment, a non-volatile memory device includes a first wiring extending in a first direction, a second wiring extending in a second direction orthogonal to the first direction, and electrically connected to the first wiring. The device includes third wirings, a first memory and a second memory. A pair of third wirings extend in a third direction crossing the first direction and orthogonal to the second direction, aligned in the second direction on both sides of the second wiring, and face each other across the second wiring. The first memory is provided between one of the third wiring pair and the second wiring. The second memory is provided between another one of the third wiring pair and the second wiring. The second wiring has a block portion between a first portion in contact with the first memory and a second portion in contact with the second memory.

Hereinbelow, embodiments are described with reference to the drawings. Identical components in the drawings are marked with the same reference numerals, and a detailed description thereof is omitted as appropriate and different components are described. The drawings are schematic or conceptual; and the relationships between the thickness and width of portions, the proportions of sizes among portions, and the like are not necessarily the same as the actual ones thereof. Further, the dimensions and proportions may be illustrated differently among drawings, even for identical portions.

In the following description, the arrangement of components are described with reference to the three axis directions orthogonal to one another as shown in the drawings, namely, the X-direction, the Y-direction, and the Z-direction. In some cases, the Z-direction may be described as upward, and the direction opposite thereto may be described downward.

First Embodiment

A non-volatile memory device 100 according to a first embodiment includes a memory cell array 1 of a three-dimensional structure. The memory cell array 1 includes memory cells (MCs) of resistance change type, for example.

The non-volatile memory device 100 according to the first embodiment will now be described with reference to FIG. 1 to FIG. 4.

FIG. 1 is a schematic perspective view showing an example of the memory cell array 1. The memory cell array 1 includes a first wiring extending in a first direction, and a second wiring extending in a second direction orthogonal to the first direction. The second wiring is electrically connected to the first wiring. The memory cell array 1 also includes third wirings extending in a third direction intersecting the first direction and orthogonal to the second direction.

In this example, the first direction is the X-direction, the second direction is the Z-direction, and the third direction is the Y-direction. The extending directions of the wirings are orthogonal to one another, but are not limited to orthogonal in a strict sense. For example, it is sufficient to be an approximately orthogonal state in which some shifts from orthogonal due to manufacturing techniques etc. are allowable. The third direction is not limited to the Y-direction orthogonal to the X-direction, and it is sufficient to be a direction intersecting the X-direction in the X-Y plane.

The first wiring is a global bit line 10 and extends in the X-direction, for example. The memory cell array 1 includes a plurality of global bit lines 10. The global bit lines 10 are provided parallel to one another and are arranged to be aligned in the Y-direction.

The second wiring is a local bit line 20 and extends in the Z-direction, for example. The local bit line 20 is electrically connected to the global bit line 10 via a select element 50, for example, a thin film transistor (TFT). A plurality of local bit lines 20 are electrically connected to one global bit line 10.

The third wiring is a word line 30 and extends in the Y-direction, for example. The memory cell array 1 includes a plurality of word lines 30. The word line 30 is provided on both sides of the local bit line 20. The word lines 30 are provided parallel to one another on each side and are arranged to be aligned in the Z-direction.

A memory layer 40 is provided between the local bit line 20 and the word line 30. The memory layer 40 contains a resistance change material that reversibly transitions between a first state and a second state having electrical resistance lower than the first state, for example.

The resistance change material contains, for example, an oxide of at least one element selected from the group consisting of hafnium (Hf), zirconium (Zr), nickel (Ni), tantalum (Ta), tungsten (W), cobalt (Co), aluminum (Al), iron (Fe), manganese (Mn), chromium (Cr), and niobium (Nb) as a main constituent. The resistance change material is a thin film containing a material such as $HfO_2$, $Al_2O_3$, $TiO_2$, NiO, $WO_3$, and $Ta_2O_5$, for example. The resistance change material reversibly changes its resistance value after passing a prescribed current or applying a prescribed voltage.

The resistance change material may be an ion-type. For example, monocrystalline or polycrystalline Si, Ge, SiGe, GaAs, InP, GaP, GaInAsP, GaN, SiC, HfSi, HfO, and AlO, a stacked film thereof, or the like may be used as the resistance change material. In such a case, an electrode of Ag, Au, Ti, Ni, Co, Al, Fe, Cr, Cu, W, Hf, Ta, Pt, Ru, Zr, or Ir, a nitride or a carbide thereof, or the like may be disposed between the resistance change material and the wiring, i.e. the bit line 20 or the word line 30, for example. A polysilicon layer containing an element mentioned above may be also used for the electrode. TaSiN layer may be preferably interposed as a barrier on a side of the resistance change material opposite to the electrode.

The memory cell array 1 further includes the select element 50 between the global bit line 10 and the local bit line 20. The select element 50 on/off-controls the electrical continuity between the global bit line 10 and the local bit line 20, for example. The select element 50 is, for example, a thin film transistor, which includes a conductive portion 51 extending in the Z-direction, a gate electrode 53 facing the side surface of the conductive portion 51, and a gate insulating film 55 provided between the conductive portion 51 and the gate electrode 53. That is, the select element 50 is a transistor having the conductive portion 50 as a channel through which an electric current flows in the Z-direction.

In FIG. 1, the illustration of the insulating films provided between the constituent parts mentioned above is omitted for convenience in viewing thereof.

Figure 2:
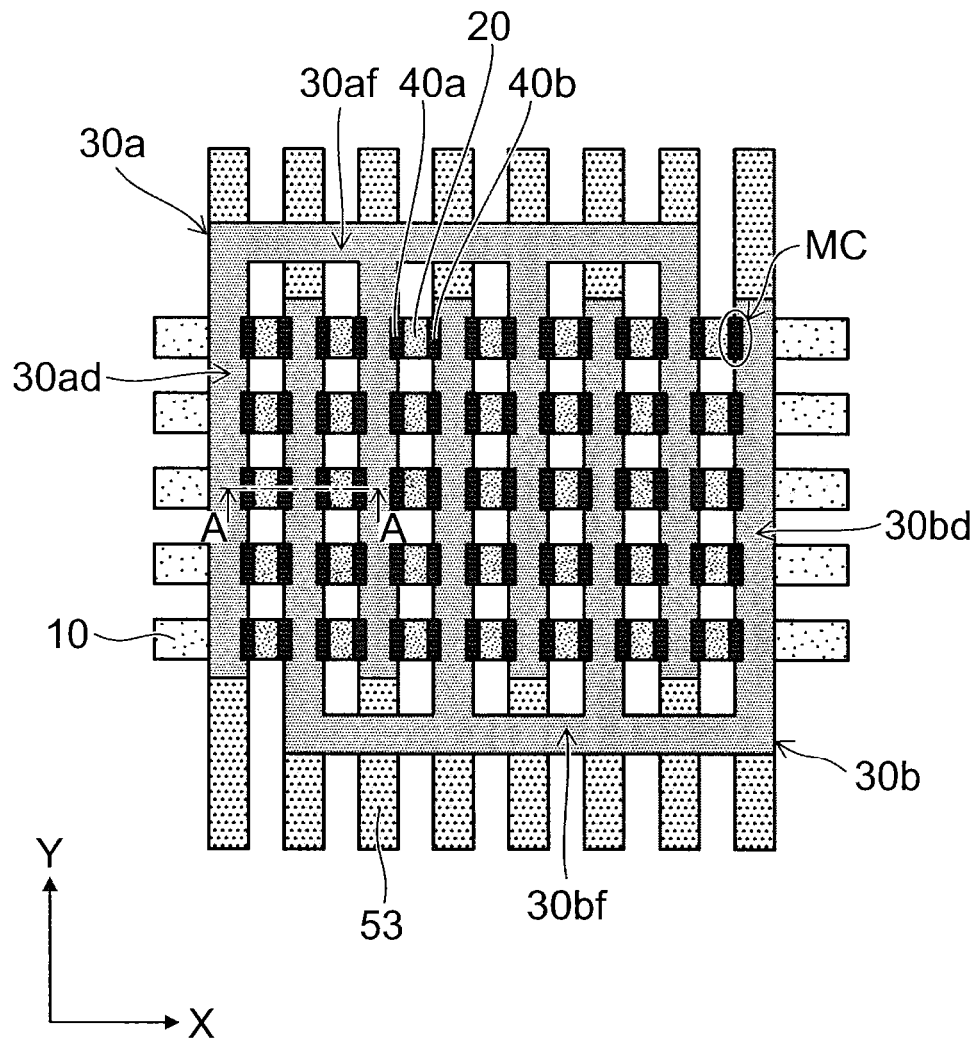
FIG. 2 is a transparent plan view schematically showing one example of the memory cell array according to the first embodiment.

FIG. 2 is a transparent plan view schematically showing one example of the memory cell array 1 as viewed from the upper side. FIG. 2 shows an arrangement of word lines 30 with respect to local bit lines 20.

As shown in FIG. 2, global bit lines 10 are provided parallel and are arranged to be aligned in the Y-direction. The local bit lines 20 are disposed on one global bit line 10 to be aligned in the X-direction. The local bit lines 20 are arranged so as to be aligned also in the Y-direction. That is, the local bit lines 20 are provided with a matrix arrangement on the global bit lines 10.

The word line 30 shown in FIG. 2 has a comb structure that includes extending portions 30d and a common portion 30f. Each extending portion extends in the Y-direction between local bit lines 20 adjacent in the X-direction, and the common portion 30f puts the extending portions 30d together. A pair of word lines 30a and 30b is provided in one layer of vertical stacking structure of the word lines 30.

In the specification, there is a case where the word lines 30 are respectively referred to as the word line 30a and 30b. Also for other components, there are a case where components of the same kind are distinguished by being marked with different reference numerals and a case where components of the same kind are collectively referred to as a representative reference numeral.

The word line 30a has a first comb structure that includes first extending portions 30ad and a first common portion 30af, and the word line 30b has a second comb structure that includes second extending portions 30bd and a second common portion 30bf. The extending portions 30ad and 30bd are respectively disposed in every other position in the X-direction. In the X-direction, the first extending portion 30ad is disposed on one side of each local bit line 20, and the second extending portion 30bd is disposed on the other side thereof, facing each other across the local bit line 20.

There may be a case, where the first extending portions 30ad is called "word line 30a", and the first extending portions 30bd is called "word line 30b". In other words, the pair of the word lines 30a and 30b face each other across the local bit line 20. A first memory layer 40a is provided between the word line 30a and the local bit line 20. A second memory layer 40b is provided between the word line 30b and the local bit line 20.

The memory cell MC is provided in each portion where the local bit line 20 and the word line 30 cross each other. That is, each memory cell MC includes either one of the first memory layer 40a and the second memory layer 40b.

As shown in FIG. 2, the gate electrode 53 of the select element 50 extends in the Y-direction below the word line 30. The gate electrode 53 extends in the Y-direction between conductive portion 51 connected to the local bit line 20, crossing the global bit line 10.

Figure 3:
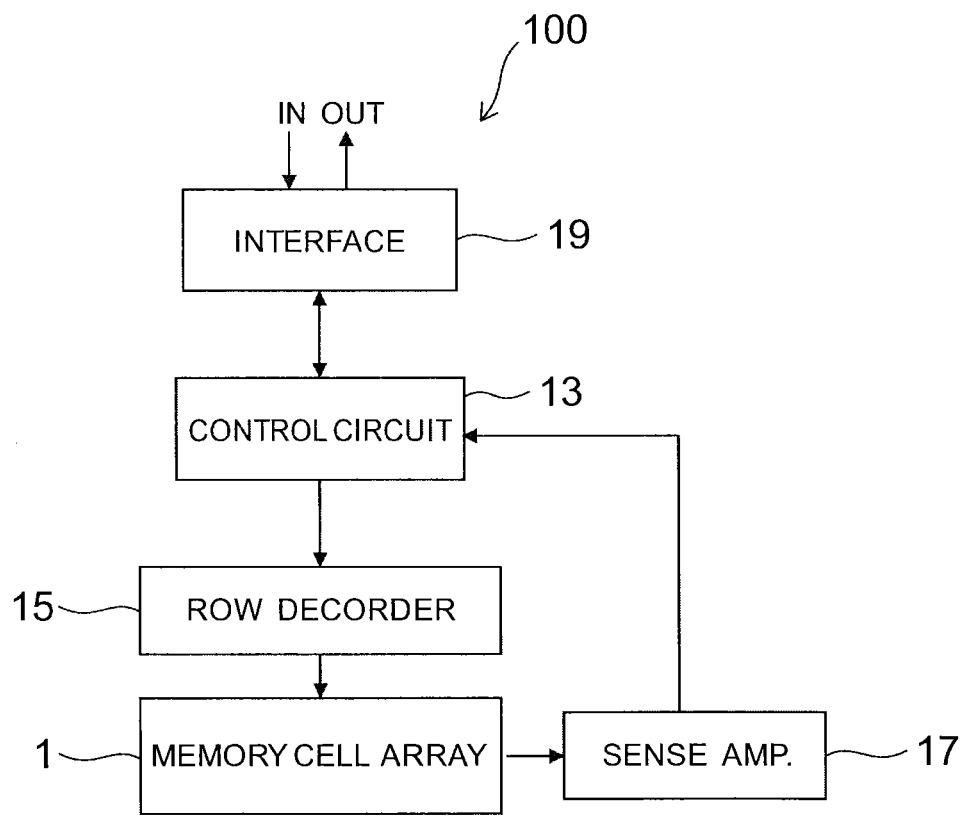
FIG. 3 is a block diagram showing the non-volatile memory device according to the first embodiment.

FIG. 3 is a block diagram showing the non-volatile memory device 100 according to the first embodiment. The non-volatile memory device 100 includes a row decoder 15 and a sense amplifier 17 that drive the memory cell array 1, for example. The sense amplifier 17 reads out data from the memory cell MC and stores them temporally. The non-volatile memory device 100 further includes a control circuit 13 and an interface circuit 19. The control circuit 13 receives commands from the outside via the interface circuit 19, and based on the command, records data in the memory cell array 1 via the row decoder 15 and reads out data via the sense amplifier 17 from the memory cell array 1.

The control circuit 13 selects one of the global bit lines 10 via the sense amplifier 17, for example. The control circuit 13 selects one of the local bit lines 20 provided on the selected global bit line 10 via the row decoder 15. Specifically, a gate bias is applied to the gate electrode 53 of the select element 50 provided between the selected global bit line 10 and the local bit line 20 in order to select the local bit line 20, and the selected global bit line 10 and the local bit line 20 are electrically connected to each other.

The control circuit 13 can select one of the word lines 30, and thereby select one of the memory cells MCs provided between the selected local bit line 20 and the word line 30. Specifically, either the word line 30a or 30b is selected at the stage where the selected memory cell MC is located.

When reading out data stored in the memory cell MC, the control circuit 13 applies a voltage to the selected word line 30, and detects the current flowing through the selected global bit line 10 with the sense amplifier 17, for example. Then, data stored in the memory cell MC is specified based on the output from the sense amplifier 17, and outputted via the interface circuit 19. When writing data (setting) on the memory cell MC or erasing data stored in the memory cell MC (resetting), a prescribed voltage is applied to the selected memory cell MC via the word line 30 to make transition from the first state to the second state and vice versa.

Figure 4:
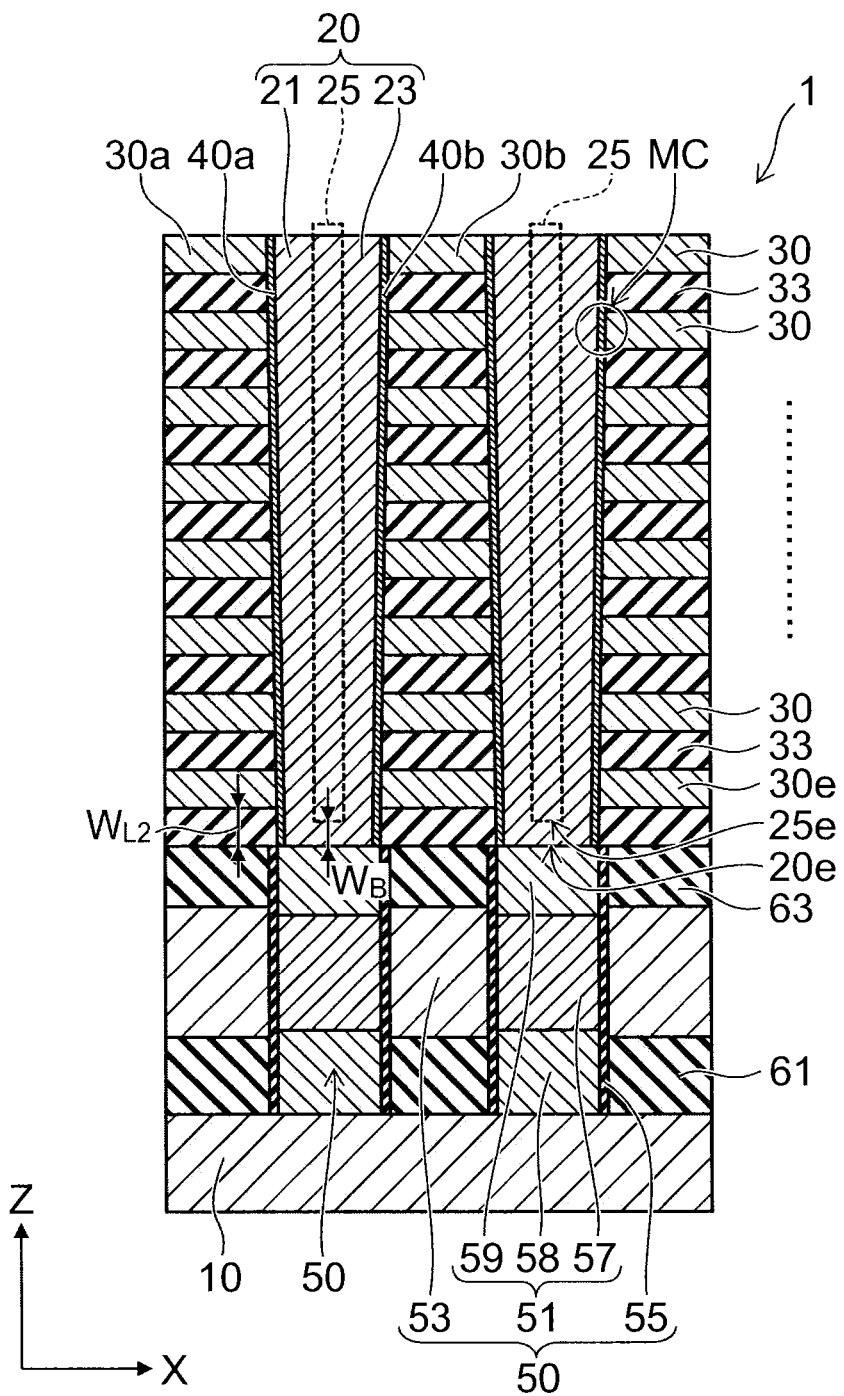
FIG. 4 is a cross-sectional view schematically showing one example of the memory cell array according to the first embodiment.

FIG. 4 is a cross-sectional view schematically showing one example of the memory cell array 1 according to the first embodiment. FIG. 4 shows a cross section taken along line A-A shown in FIG. 2.

As shown in FIG. 4, the select element 50 is provided on the global bit line 10. The select element 50 includes the conductive portion 51, the gate electrode 53 facing the side surface of the conductive portion 51, and the gate insulating film 55 provided between the conductive portion 51 and the gate electrode 53.

The conductive portion 51 includes a channel portion 57, a source drain portion 58 provided on a lower side thereof and a source drain portion 59 provided on an upper side thereof. The channel portion 57 faces the gate electrode 53 via the gate insulating film 55. The source drain portion 58 is connected to the global bit line 10. On the other hand, the source drain portion 59 is connected to the local bit line 20.

An insulating layer 61 is provided between the global bit line 10 and the gate electrode 53. An insulating layer 63 is provided on the gate electrode 53. A silicon oxide film may be used for the insulating layers 61 and 63, for example.

The local bit line 20 and the word lines 30 are provided on the select element 50. The word lines 30 are stacked in the Z-direction via an insulating layer 33. The word line 30a and the word line 30b are provided alternately in the X-direction between local bit lines 20 adjacent to each other.

The first memory layer 40a is provided between the local bit line 20 and the word line 30a. The second memory layer 40b is provided between the local bit line 20 and the word line 30b.

As shown in FIG. 4, the local bit line 20 has a first portion 21 in contact with the first memory layer 40a and a second portion 23 in contact with the second memory layer 40b, and includes a block portion 25 therebetween.

Figure 5A:
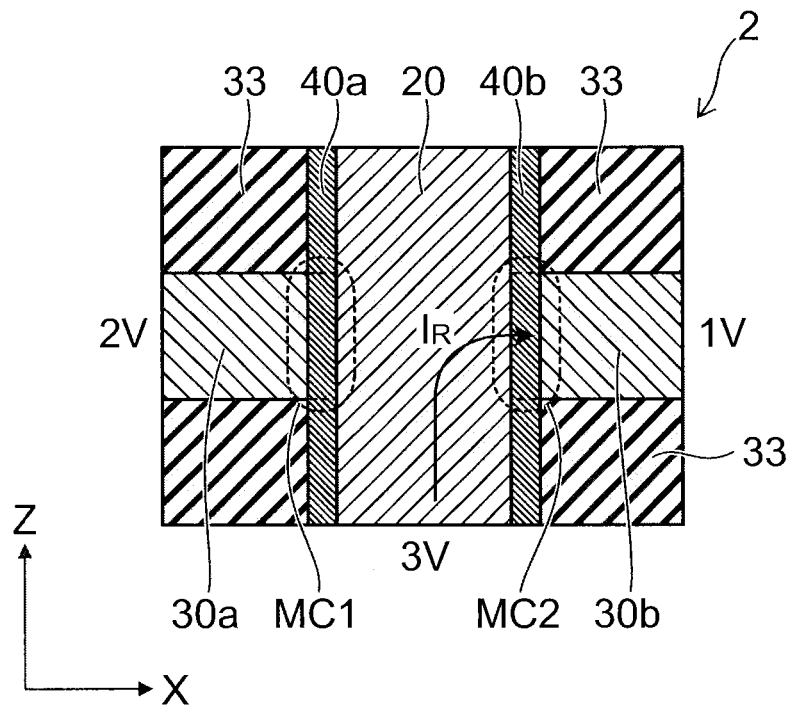
FIGS. 5A and 5B are schematic diagrams showing a memory cell array according to a comparative example.
Figure 5B:
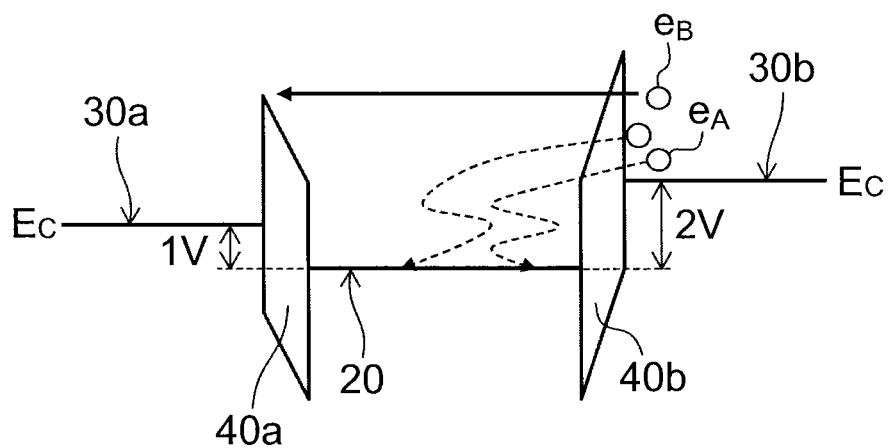

FIGS. 5A and 5B are schematic diagrams showing a memory cell array 2 according to a comparative example. FIG. 5A is a partial cross-sectional view of the memory cell array 2, and FIG. 5B is an energy band diagram in the cross section.

As shown in FIG. 5A, the block portion 25 is not provided in the memory cell array 2. A memory cell MC1 including the first memory layer 40a is provided between the local bit line 20 and the word line 30a. A memory cell MC2 including the second memory layer 40b is provided between the local bit line 20 and the word line 30b.

As shown in FIG. 5A, the control circuit 13 applies different voltages respectively to the word lines 30a and 30b facing each other across the local bit line 20. When resetting the memory cell MC2, the electric potential of the local bit line 20 is set to 3 V, the electric potential of the word line 30a is set to 2 V, and the electric potential of the word line 30b is set to 1 V, for example. That is, a potential difference of 1 V is given to the memory cell MC1, and a potential difference of 2 V is given to the memory cell MC2.

The thickness of the memory layer 40 is several nanometers, for example, and a strong electric field of the order of $10^6$ V/cm is applied to the memory layer 40. Thereby, a reset current $I_R$ flows through MC2, and makes the transition in the second memory layer 40b from the second state (low resistance) to the first state (high resistance), for example. On the other hand, the half voltage thereof is applied to the MC1, and the current flowing through the first memory layer 40a is smaller than the reset current $I_R$. Therefore, the resistance state of the first memory layer 40a may not be changed.

FIG. 5B shows an energy band diagram when the potential difference applied between the local bit line 20 and the word line 30a is set to 1 V and the potential difference applied between the local bit line 20 and the word line 30b is set to 2 V. The horizontal line Ec in FIG. 5B shows the energy level of the conduction band in the local bit line 20 and the word lines 30a and 30b.

When a reset current $I_R$ flows from the local bit line 20 to the word line 30b through the second memory layer 40b, electrons $e_A$ and $e_B$ that serves as current carriers move from the word line 30b to the local bit line 20, for example. Most of the electrons $e_A$ moving from the word line 30b to the local bit line 20 are scattered in the local bit line 20, and lose their kinetic energy.

However, as a width of the local bit line 20 in the X-direction is narrowed, for example, to 40 nm or less, some electrons may pass through the local bit line 20 without being scattered and flow into the memory cell MC1. These electrons $e_B$ may cause unintentional transition of the resistance state in the first memory layer 40a, and change the data stored in the memory cell MC1. Such a phenomenon may occur with higher probability as the width of the local bit line 20 becomes narrower. Thus, the phenomenon called "disturb" between memory cells may reduce the reliability of the non-volatile memory device.

In the embodiment, the block portion 25 is provided in the local bit line 20 to suppress the movement of carries (electrons or holes) between the memory cell MC1 and the memory cell MC2. Thereby, it is possible to improve the reliability in the non-volatile memory device 100.

Figure 6A:
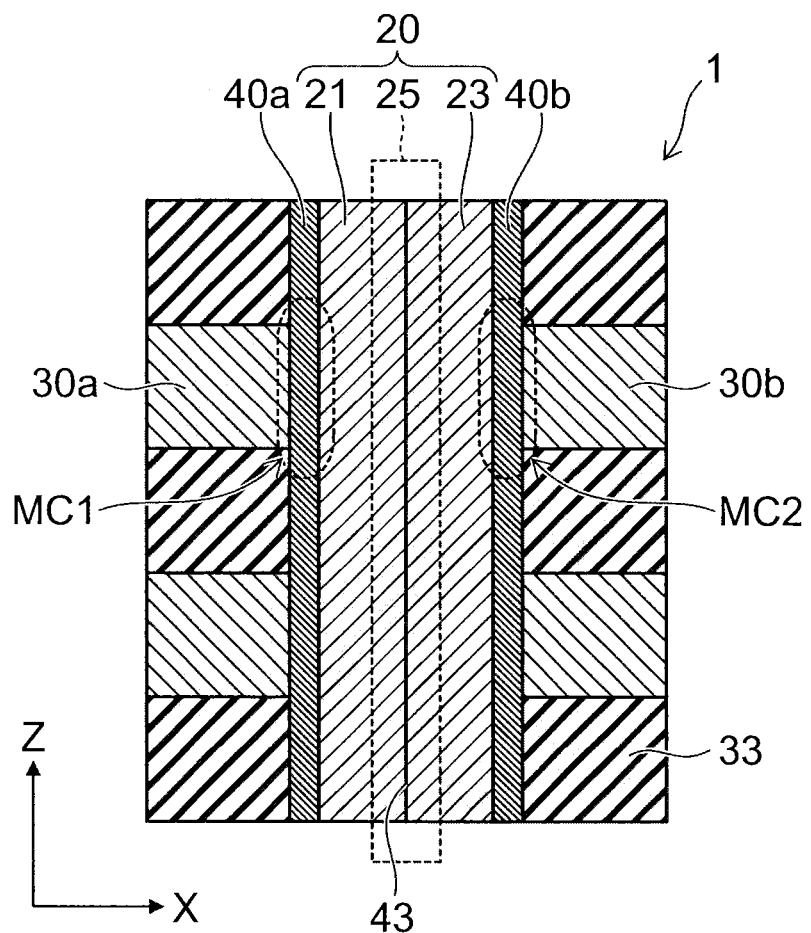
FIGS. 6A and 6B are schematic diagrams showing one example of the memory cell array according to the first embodiment.
Figure 6B:
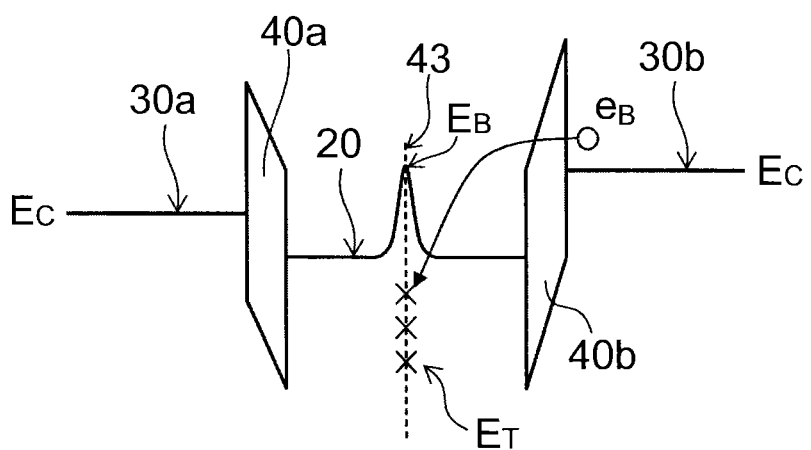

FIGS. 6A and 6B are schematic diagrams showing one example of the memory cell array 1 according to the first embodiment. FIG. 6A is a partial cross-sectional view of the memory cell array 1, and shows an example of the block portion 25 provided in the local bit line 20. FIG. 6B is a schematic energy band diagram modulated by the block portion 25 shown in FIG. 6A.

As shown in FIG. 6A, the block portion 25 of this example includes an interface 43 where the first portion 21 and the second portion 23 are in contact. That is, the block portion 25 is provided around the interface 43, which is so called a seam. The interface 43 may induce a local bending $E_B$ of the energy band. In another aspect, a carrier trap $E_T$ (trap center) or the like may be generated at the interface 43.

As shown in FIG. 6B, electrons $e_B$ having high energy flow from the word line 30b through the second memory layer 40b into the local bit line 20 due to the applied voltage between the local bit line 20 and the word line 30. While the electrons $e_B$ pass through the local bit line 20 toward the first memory layer 40a, the movement of the electrons $e_B$ in the X-direction may be blocked by a potential barrier due to the energy band bending $E_B$, or by trapping in the carrier trap $E_T$ formed at the interface 43. A density of the carrier traps $E_T$ formed at the interface 43 may become higher than that of scattering centers in the first portion 21 and the second portion 23, and effectively suppress electrons $e_B$ flowing into the first memory layer 40a, for example. Thereby, it is possible to suppress the malfunction of the memory cell MC1.

The first portion 21 and the second portion 23 may contain a semiconductor material such as polysilicon, for example. Thus, the interface 43 forms a discontinuous surface of a semiconductor crystal, where the first portion 21 and the second portion 23 are in contact, and includes carrier traps $E_T$ at high density.

Next, the manufacturing process of the memory cell array 1 is described with reference to FIGS. 7 to 11C.

FIGS. 7 to 11C are schematic views showing one example of the manufacturing process of the memory cell array according to the embodiment. FIGS. 7, 8B, 9A to 10B, 11B and 11C are partial cross-sectional views of a wafer. FIG. 8A and FIG. 11A are plan views showing the upper surface of the wafer.

First, a wafer is prepared, in which the select element 50 is formed on the global bit line 10. The wafer may include peripheral circuits such as the control circuit 13, the row decoder 15, and the sense amplifier 17. The global bit line 10 is formed on a silicon substrate via an interlayer insulating film, for example. Then, the select element 50 is formed on the global bit line 10.

Figure 7:
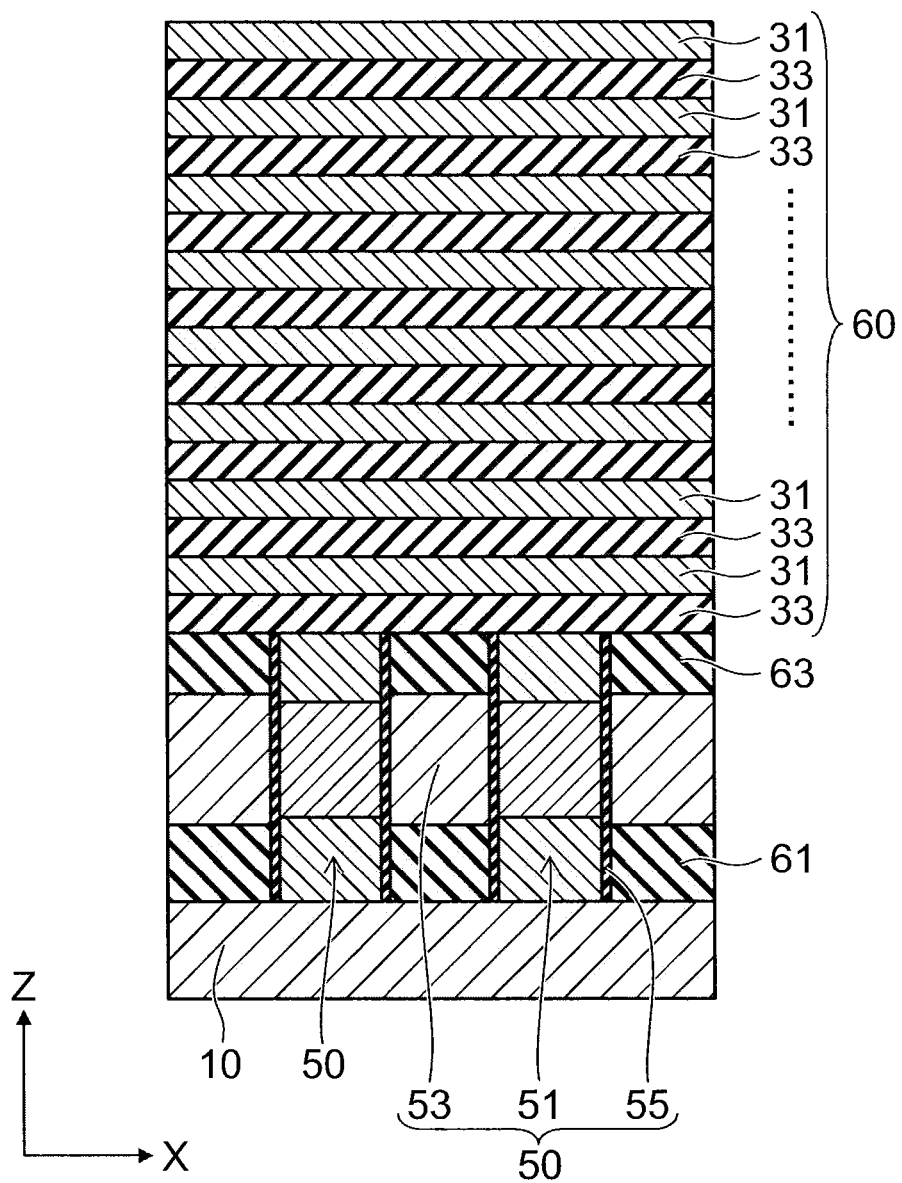
FIGS. 7 to 11C are schematic views showing one example of the manufacturing process of the memory cell array according to the first embodiment.

Next, as shown in FIG. 7, a stacked body 60 is formed on the select element 50. The stacked body 60 includes insulating layers 33 and conductive layers 31. The insulating layer 33 is a silicon oxide film formed using the CVD (chemical vapor deposition) method, for example. The conductive layer 31 is a polysilicon film formed using the CVD method, for example. The insulating layer 33 and the conductive layer 31 are alternately stacked in the Z-direction.

Figure 8A:
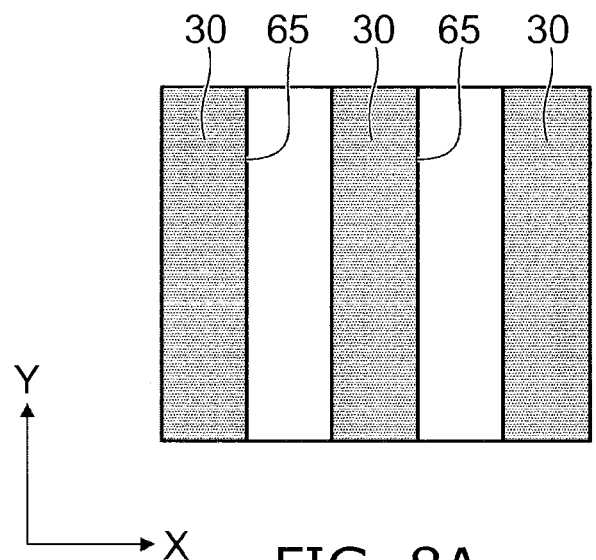
Figure 8B:
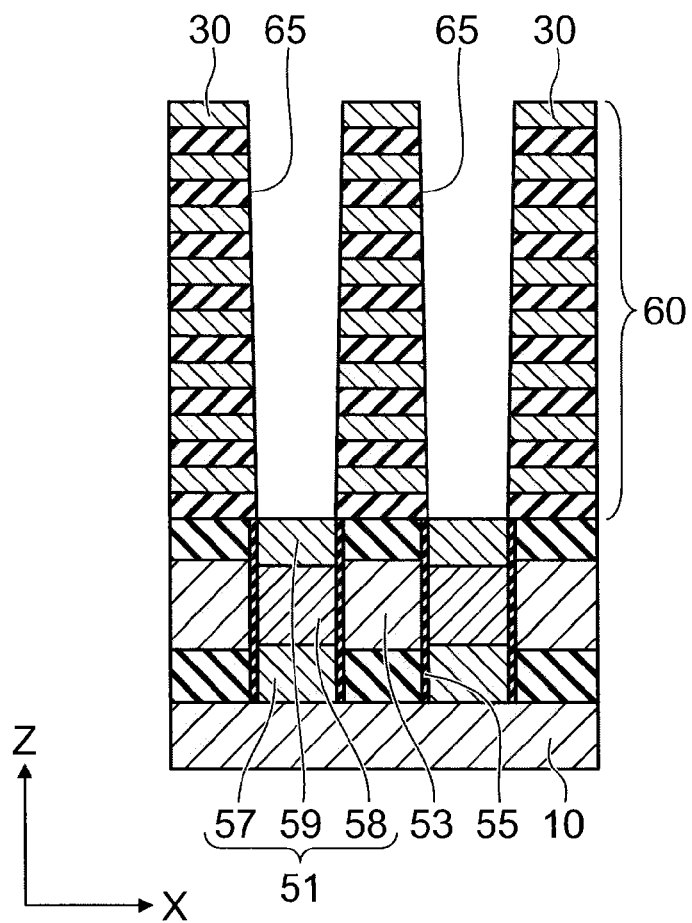

Next, as shown in FIGS. 8A and 8B, the stacked body 60 is selectively etched in order to form slits 65. The stacked body 60 is etched using the RIE (reactive ion etching) method, for example. An etching mask (not-shown) is provided on the stacked body 60.

As shown in FIG. 8A, the slit 65 is formed so as to extend in the Y-direction. The slit 65 is formed with a depth reaching the select element 50 from the upper surface of the stacked body 60. The source drain portion 59 of the conductive unit 51 is exposed at the bottom surface of the slit 65.

Figure 9A:
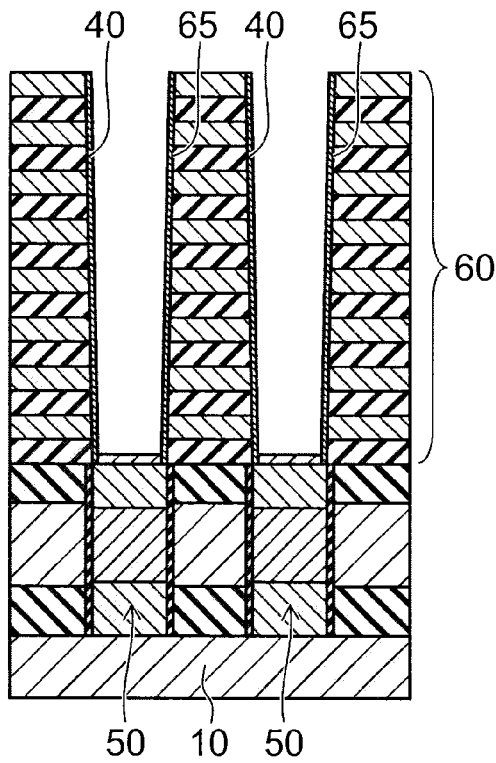

Next, as shown in FIG. 9A, the memory layer 40 is formed on the inner surface of the slit 65. The memory layer 40 contains a resistance change material, which is formed using the ALD (atomic layer deposition) method, for example. The thickness of the memory layer 40 is several nanometers, for example.

Figure 9B:
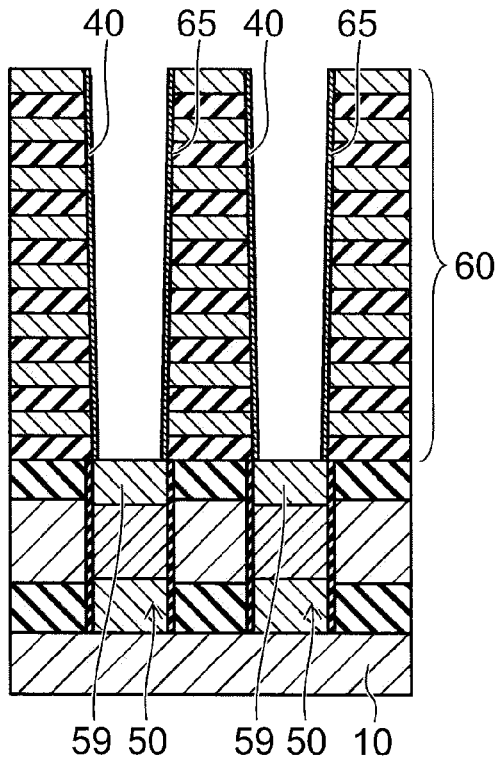

As shown in FIG. 9B, the memory layer 40 formed on the bottom surface of the slit 65 is selectively removed to expose the source drain portion 59. By using anisotropic etching conditions of RIE, the memory layer 40 formed on the bottom surface of the slit 65 can be selectively removed, leaving the memory layer 40 on the sidewall of the slit 65, for example.

Figure 10A:
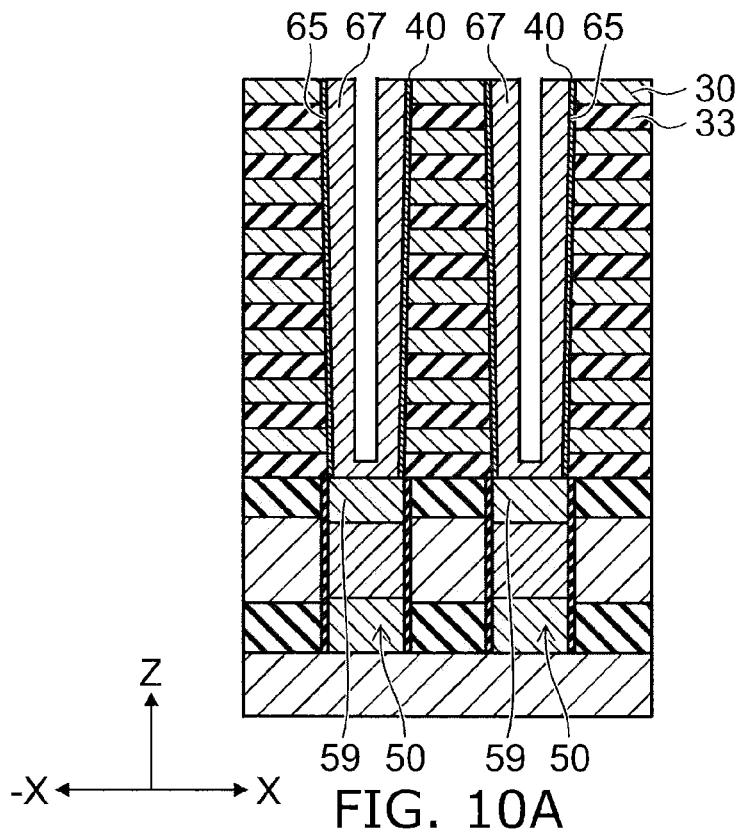

Next, as shown in FIG. 10A, a conductive layer 67 is formed on the inner surface of the slit 65. The conductive layer 67 may be a metal film or a polysilicon film, for example. For forming the conductive layer 67, an isotropic growth method, such as the ALD method and the CVD method, is preferably used. The conductive layer 67 is deposited in the horizontal direction (the X-direction and the −X-direction) on the memory layer 40 provided on the sidewall of the slit 65. When the film growth is isotropic, a homogeneous conductive layer 67 with a uniform thickness may be formed on the sidewall of the slit 65.

Figure 10B:
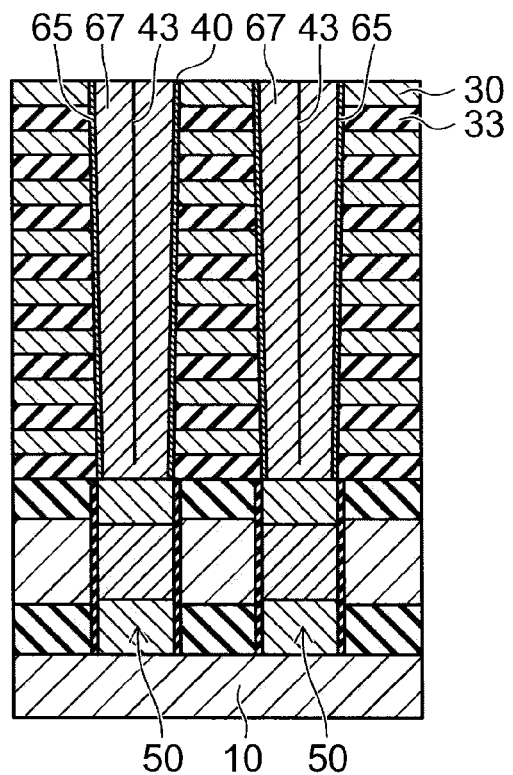

Further depositing the conductive layer 67 may bury the space of the slit 65 as shown in FIG. 10B. The conductive layers 67 deposited on both sidewalls of the slit 65 may be joined together at the center of the slit 65, and a joining surface (so-called seam) or a crystalline discontinuous surface is formed so as to extend in the Z-direction. At the discontinuous surface, the potential barrier due to the energy band bending may block the movement of electrons in the X-direction. The seam or the discontinuous surface may include crystal defects at high density, each of which serves mainly as a carrier trap. Next, as shown in FIGS. 11A and 11B, the conductive layer 67 is selectively etched, and divided into the local bit lines 20.

Figure 11A:
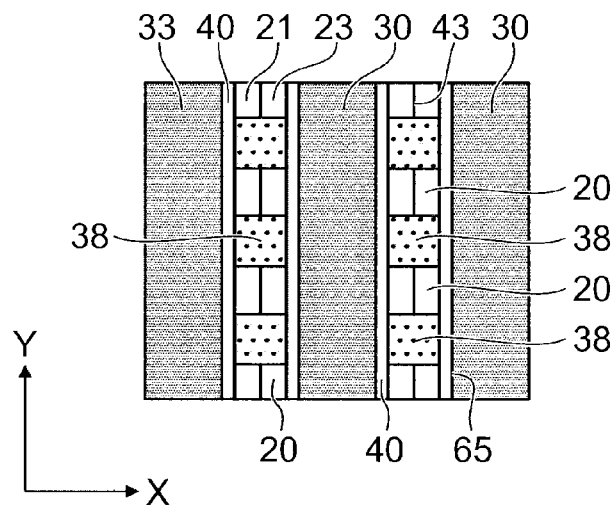

As shown in FIG. 11A, insulators 38 are provided between the conductive layers 67 extending in the Y-direction, and isolate therebetween, forming local bit lines 20. Specifically, in the portion where the insulator 38 will be formed, the conductive layer 67 is etched to a depth reaching the insulating layer 63 from the upper surface of the conductive layer 67. The insulating layer 63 is provided so as to fill the space between select elements 50 adjacent in the Y-direction.

Figure 11B:
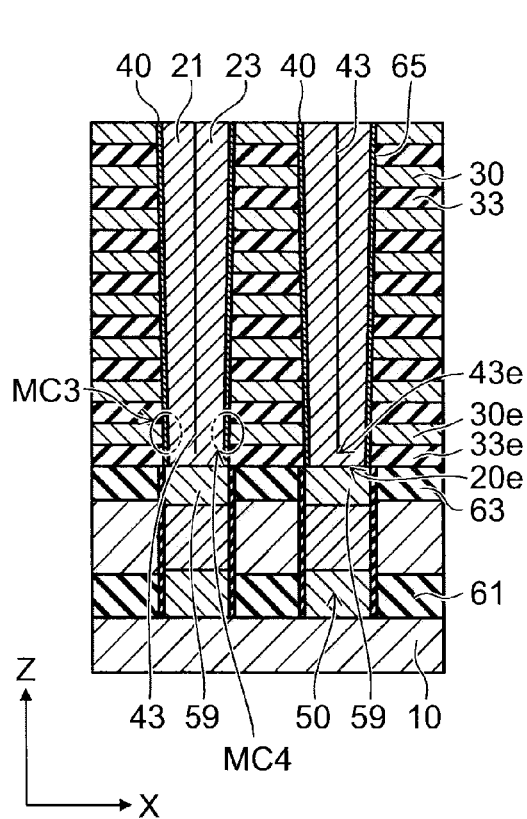

That is, as shown in FIG. 11B, the conductive layer 67 is removed so as to leave the portion in communication with the source drain portion 59 of the select element 50. Subsequently, a silicon oxide film, for example, is buried in the space so as to form the insulator 38, where the conductive layer 67 is removed.

In the memory cell array 1 manufactured through the process mentioned above, the interface 43 is formed in the local bit line 20. As shown in FIGS. 11A and 11B, the interface 43 extends in the Y-direction and the Z-direction, and divides the local bit line 20 into the first portion 21 and the second portion 23.

On the other hand, the local bit line 20 includes part of the conductive layer 67 deposited on the source drain portion 59, in a portion in contact with the source drain portion 59. Therefore, the interface 43 does not extend to the end 20e of the local bit line 20 on the global bit line 10 side. Here, to suppress the disturb between memory cells MC3 and MC4 formed in a position nearest to the global bit line 10, it is preferable that the end 43e of the interface 43 be located below the word line 30e formed in a position nearest to the global bit line 10. It is possible to form the insulating layer 33e on the select element 50, which is thicker than the conductive layer 67 disposed on the source drain portion 59.

In other words, reference to FIG. 4, i.e. the spacing ($W_B$) between the end 25e of the block portion 25 on the global bit line 10 side and the end 20e of the local bit line 20 may be preferably provided to be narrower than the spacing ($W_{L2}$) between the word line 30e nearest to the global bit line 10 among the word lines 30 and the end 20e of the local bit line 20.

Figure 11C:
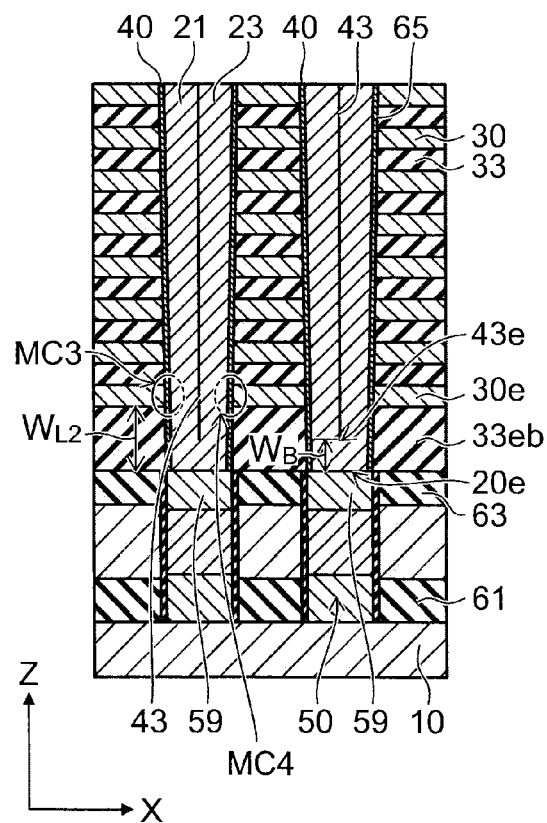

As shown in FIG. 11C, the film thickness of the lowermost insulating film 30eb may be thicker than the film thickness of the other insulating films 33e. That is, as the width of the slit 65 becomes narrower, the spacing WB becomes larger. However, if a thickness of all the insulating films 30e is thick, the height of the slit 65 becomes too high. Hence, it is preferable to form the film thickness of the lowermost insulating film 30eb thicker than the other insulating film 30, so that the spacing $W_{L2}$ is made larger than $W_L$ ($W_L < W_{L2}$). Thus, the relationship of spacing $W_B <$ spacing $W_{L2}$ can be maintained even when the width of the slit 65 is narrow.

In the structure mentioned above, it can be said that the spacing between the lower surface of the word line 30e and the end 20e of the local bit line 20 is wider than the spacing between two word lines 30 adjacent in the Z-direction among the word lines 30 stacked in the Z-direction.

Figure 12:
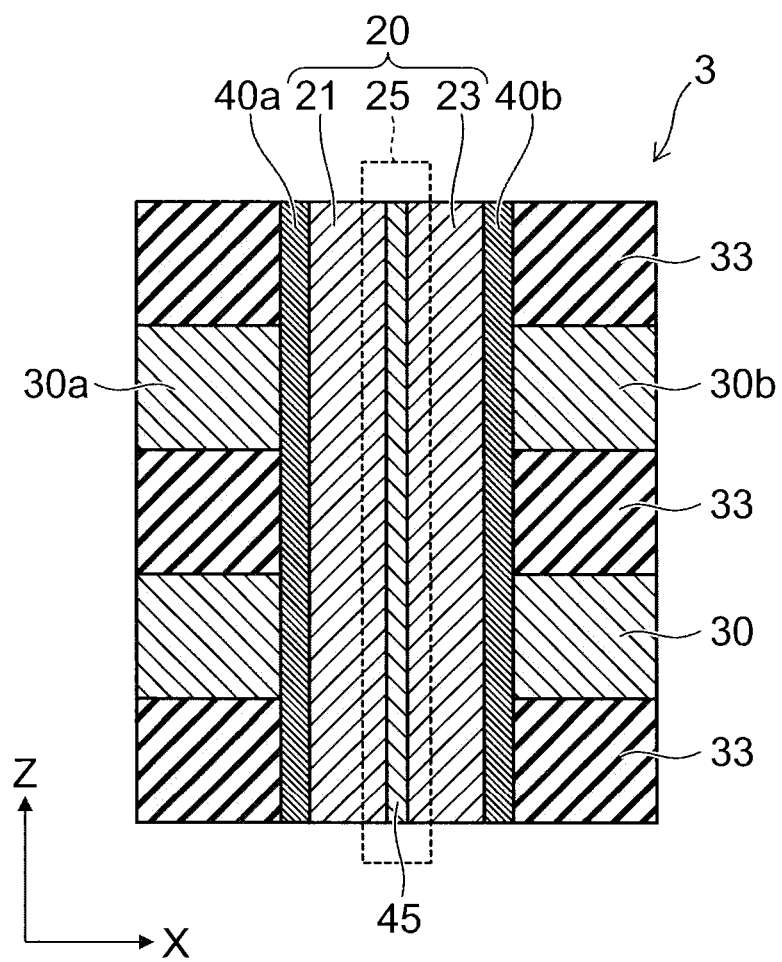
FIG. 12 is a schematic cross-sectional view showing one example of a memory cell array according to a variation of the first embodiment.

FIG. 12 is a schematic cross-sectional view showing one example of a memory cell array 3 according to a variation of the first embodiment.

In the memory cell array 3, the block portion 25 includes a block layer 45 provided between the first portion 21 and the second portion 23. The first portion 21 and the second portion 23 specifically contain a first metal. The block layer 45 contains a second metal having a smaller work function than the first metal. The first metal is tantalum nitride (TaN), for example, and the second metal is tungsten (W), for example.

Thereby, a potential barrier is formed between the first portion 21 and the block layer 45 and between the second portion 23 and the block layer 45. Electrons $e_B$ that are injected into the local bit line 20 from the word line 30b through the second memory layer 40b can be prevented from flowing into the first memory layer 40a, for example. Electrons that flow from the word line 30a through the first memory layer 40a into the local bit line 20 may be also prevented from being injected into the second memory layer 40a.

In another example, the first portion 21 and the second portion 23 may contain a first semiconductor, and the block layer 45 may contain a second semiconductor having a wider band gap than the first semiconductor. For example, silicon may be used as the first semiconductor, and gallium arsenide (GaAs) or gallium nitride (GaN) may be used as the second semiconductor. That is, the discontinuity of the energy band between the first semiconductor and the second semiconductor forms a potential barrier, and may block the movement of carries in the X-direction in the local bit line 20.

Figure 13A:
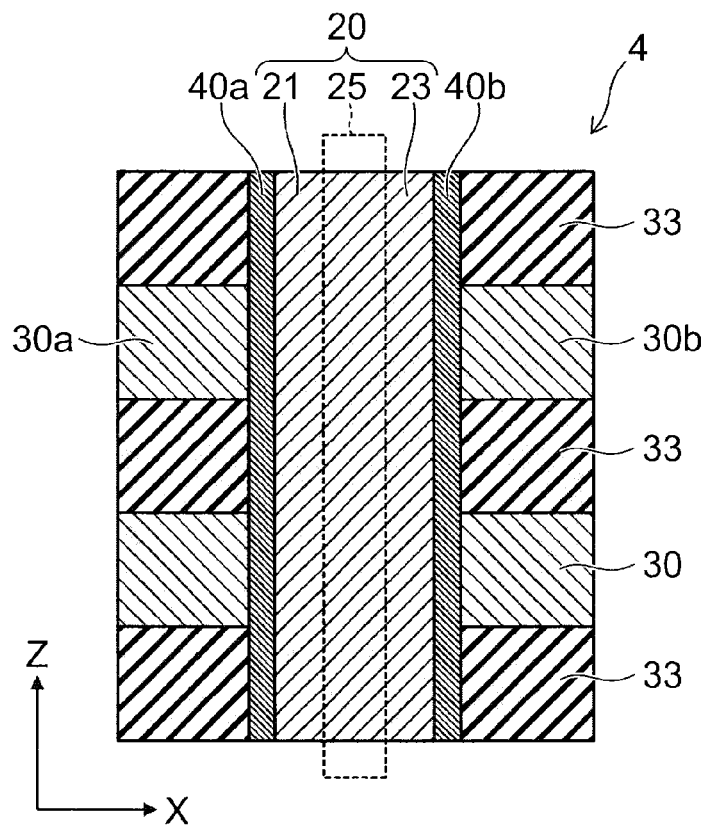
FIGS. 13A to 13C are schematic diagrams showing a memory cell array according to another variation of the first embodiment.
Figure 13B:
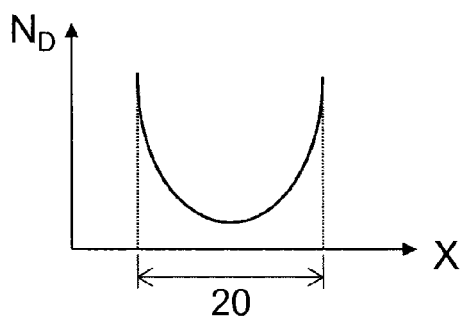
Figure 13C:
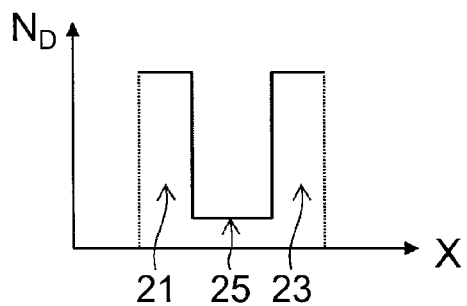

FIGS. 13A to 13C are schematic diagrams showing a memory cell array 4 according to another variation of the first embodiment. FIG. 13A is a partial cross-sectional view showing the memory cell array 4. FIGS. 13B and 13C show impurity profiles of the local bit line 20.

In the memory cell array 4, the local bit line 20 contains a semiconductor. The impurity concentration of the block portion 25 is lower than the impurity concentration of the first portion 21. The impurity concentration of the block portion 25 is lower than the impurity concentration of the second portion 23. Therefore, a potential barrier due to the concentration difference is formed between the block portion 25 and the first portion 21, and also between the block portion 25 and the second portion. Then, the block portion 25 may suppress the movement of carriers in the X-direction in the local bit line 20.

As shown in FIG. 13B, the impurity distribution in the local bit line 20 is formed so as to continuously decrease from the first memory layer 40a side or the second memory layer 40b side toward the center. That is, while depositing the conductive layer 67 (see FIGS. 10A and 10B), the doping amount of the impurity is set large in a first half of the deposition time, and is set small in the second half thereof, for example.

As shown in FIG. 13C, the impurity distribution in the local bit line 20 may be formed so as to decrease in a step form at a boundary between the first portion 21 and the block portion 25, and at another boundary between the second portion 23 and the block portion 25. The local bit line 20 contains polysilicon, for example. The impurity doped into the local bit line 20 is arsenic (As), phosphorus (P), or boron (B), for example.

Second Embodiment

Figure 14:
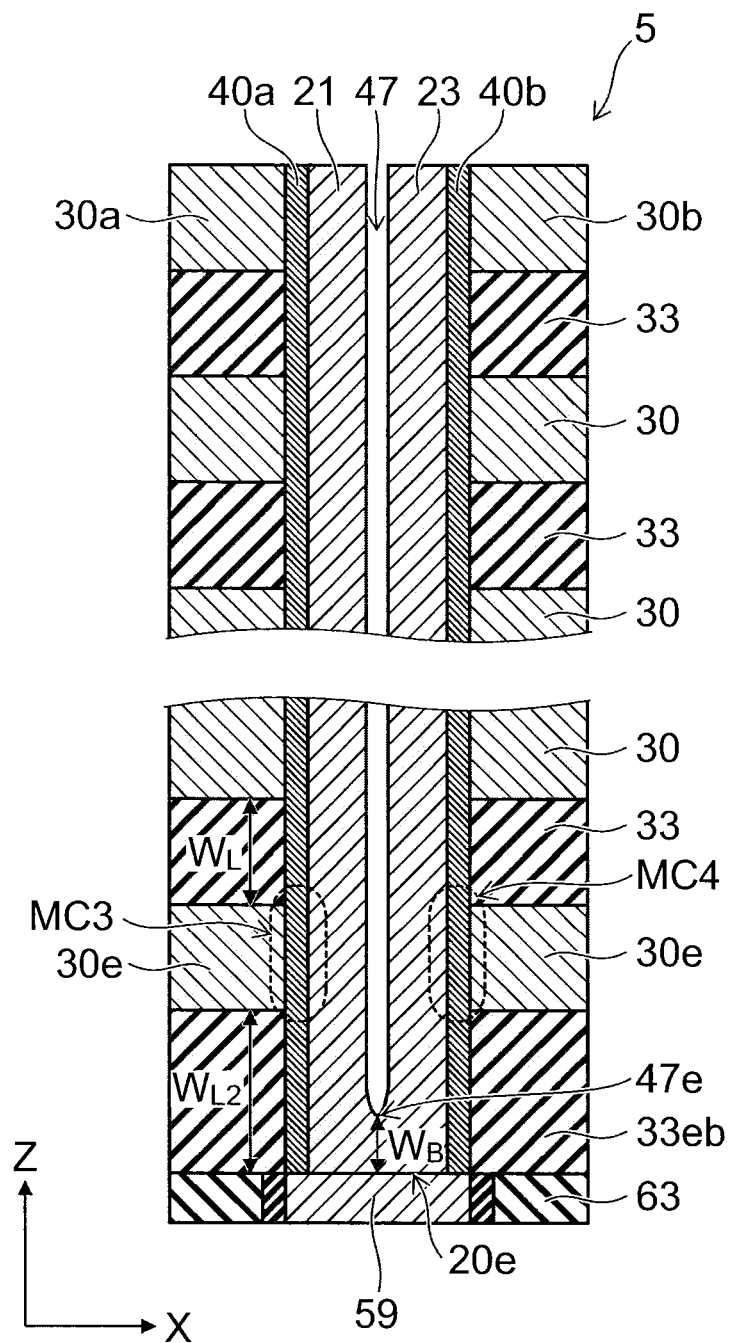
FIG. 14 is a cross-sectional view schematically showing one example of a memory cell array according to a second embodiment.

FIG. 14 is a cross-sectional view schematically showing one example of a memory cell array 5 according to a second embodiment.

As shown in FIG. 14, in the memory cell array 5, the local bit line 20 has a gap 47 between the first portion 21 in contact with the first memory layer 40a and the second portion 23 in contact with the second memory layer 40b. In the process shown in FIG. 10A, before joining the conductive layers 67 deposited on both sidewalls of the slit 65 together in the X-direction, the deposition is suspended, for example. Thereby, a space can be formed between the first portion 21 and the second portion 23.

The gap 47 extends in the Z-direction in the local bit line 20. The gap 47 may block the movement of carries that flow from one of the word lines 30a and 30b through the memory layer 40 into the local bit line 20, preventing the carrier from moving toward the other of the word lines 30a and 30b. Thereby, the "disturb" can be suppressed between memory cells facing each other across the local bit line 20.

It is preferable that the spacing $W_B$ is narrower than the spacing $W_L$. As shown in FIG. 14, the spacing $W_B$ is the one between the end 47e of the gap 47 on the global bit line 10 side and the end 20e of the local bit line on the global bit line 10 side. The spacing $W_L$ is the one between the word line 30e nearest to the global bit line 10 out of the plurality of word lines 30 and the end 20e of the local bit line 20. Thereby, the "disturb" can be suppressed between the memory cells MC3 and MC4 formed in a position nearest to the global bit line 10.

The film thickness of the lowermost insulating film 30eb may be thicker than the film thickness of the other insulating films 33e. That is, when the width of the slit 65 becomes narrower, the spacing $W_B$ becomes larger. However, if a thickness of all the insulating films 30e is thick, the height of the slit 65 becomes too high. Thus, by forming the film thickness of the lowermost insulating film 30eb thicker, the spacing $W_{L2}$ is made larger ($W_L < W_{L2}$). Therefore, the relationship of spacing $W_B$ < spacing $W_{L2}$ can be maintained even when the width of the slit 65 is narrow.

In the structure mentioned above, it can be said that the spacing between the lower surface of the word line 30e and the end 20e of the local bit line 20 is wider than the spacing between two word lines 30 adjacent in the Z-direction among the word lines 30 stacked in the Z-direction.

Third Embodiment

Figure 15:
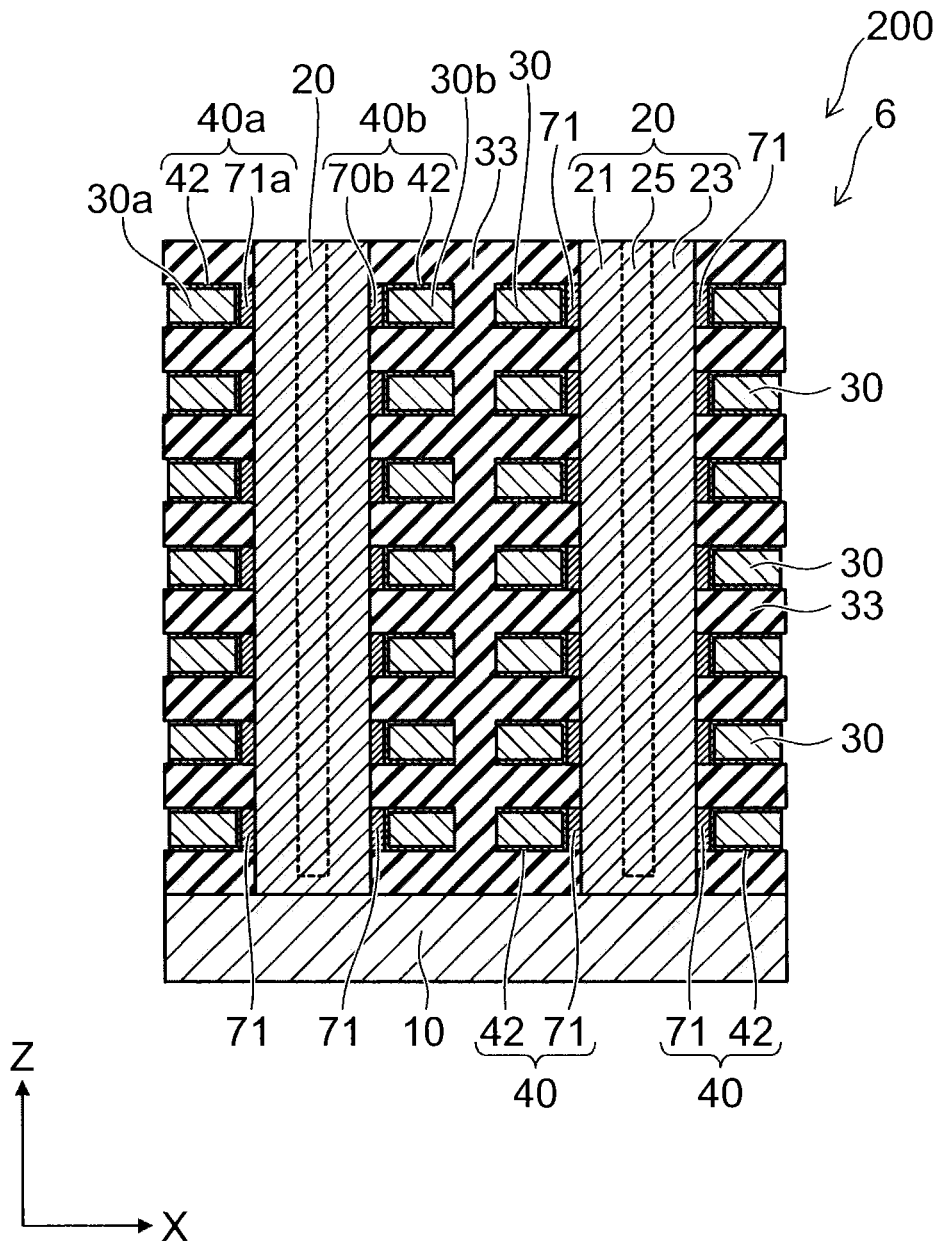
FIG. 15 is a schematic cross-sectional view showing one example of a memory cell array of a non-volatile memory device according to a third embodiment.

FIG. 15 is a schematic cross-sectional view showing one example of a memory cell array 6 of a non-volatile memory device 200 according to a third embodiment.

The non-volatile memory device 200 is called a vertical cross-point structure, and the local bit line 20 is directly connected to the global bit line 10. A rectifying element, for example, a diode is provided between the local bit line 20 and the word line 30.

As shown in FIG. 15, in the memory cell array 6, the local bit line 20 is directly connected to the global bit line 10. Word lines 30 are aligned on both sides of the local bit line 20. In this example, a word line 30 disposed between local bit lines 20 adjacent in the X-direction faces one of the local bit lines 20 via the memory layer 40. The memory layer 40 includes a resistance change layer 42 provided on the word line 30 side and a rectifying layer 71 in contact with the local bit line 20.

The word line 30a and the word line 30b shown in FIG. 15 face each other across the local bit line 20 in the X-direction. The first memory layer 40a is provided between the local bit line 20 and the word line 30a. The second memory layer 40b is provided between the local bit line 20 and the word line 30b.

The first memory layer 40a includes a first rectifying layer 71a in a portion in contact with the local bit line 20. The second memory layer 40b includes a second rectifying layer 71b in a portion in contact with the local bit line 20.

The first rectifying layer 71a interposes a first diode between the first memory layer 40a and the local bit line 20. The second rectifying layer 71b interposes a second diode between the second memory layer 40b and the local bit line 20.

When the local bit line 20 contains a metal, the rectifying layer 71 contains a semiconductor, for example. Thereby, a Schottky diode can be interposed between the local bit line 20 and the memory layer 40. When the local bit line 20 contains a semiconductor, the rectifying layer 71 contains a semiconductor of a different conductivity type from the local bit line 20. Thereby, a P-N junction diode can be interposed between the local bit line 20 and the memory layer 40.

Also in the embodiment, the local bit line 20 has the first portion 21 in contact with the first memory layer 40a and the second portion 23 in contact with the second memory layer 40b, and includes the block portion 25 between them. The block portion 25 block the movement of carriers that flow from one of the word lines 30a and 30b through the memory layer 40 into the local bit line 20, and preventing the carriers from moving toward the other of the word lines 30a and 30b. Thereby, the "disturb" can be suppressed between memory cells facing each other across the local bit line 20. The block portion 25 may have the same structure as the first embodiment. It is possible to provide the gap 47 between the first portion 21 and the second portion 23.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A non-volatile memory device comprising:
   a first wiring extending in a first direction;
   a second wiring extending in a second direction orthogonal to the first direction, and electrically connected to the first wiring;
   third wirings extending in a third direction orthogonal to the second direction, a pair of the third wirings being aligned in the second direction on both sides of the second wiring, and facing each other across the second wiring;
   a first memory provided between one wiring included in the pair of the third wirings and the second wiring; and
   a second memory provided between another wiring included in the pair of the third wirings and the second wiring, and
   the second wiring having a blocking portion between a first portion in contact with the first memory and a second portion in contact with the second memory.

2. The device according to claim 1, wherein the blocking portion includes an interface where the first portion and the second portion are in contact with each other.

3. The device according to claim 2, wherein the blocking portion includes a carrier trap at the interface.

4. The device according to claim 1, wherein
   the first portion and the second portion contain a first metal and
   the blocking portion contains a second metal having a work function smaller than the first metal.

5. The non-volatile memory device according to claim 4, wherein
   the first metal is tantalum nitride (TaN) and
   the second metal is tungsten (W).

6. The device according to claim 1, wherein
   the second wiring contains a semiconductor and
   the blocking portion has a lower impurity concentration than the first portion and the second portion.

7. The device according to claim 6, wherein the second wiring contains polysilicon.

8. The device according to claim 1, wherein
   the first portion and the second portion contain a first semiconductor and
   the blocking portion contains a second semiconductor having a wider band gap than the first semiconductor.

9. The device according to claim 1, wherein the first memory and the second memory contain a resistance change material that reversibly transitions between a first state and a second state having electrical resistance lower than the first state.

10. The device according to claim 1, further comprising second wirings aligned in the first direction,
    wherein one of the third wirings has a first comb structure that includes the one wiring of the pair as a first extending portion, and
    another one of the third wirings has a second comb structure that includes another wiring of the pair as a second extending portion.

11. The device according to claim 1, further comprising third wirings stacked in the second direction,
    the blocking portion extending in the second direction in the second wiring,
    wherein a spacing between an end of the blocking portion on the first wiring side and an end of the second wiring on the first wiring side is narrower than a spacing between a third wiring nearest to the first wiring and the end of the second wiring.

12. The device according to claim 11, wherein a spacing between a lower surface of a third wiring nearest to the first wiring and the end of the second wiring is wider than a spacing between third wirings adjacent to each other in the second direction.

13. The device according to claim 1, wherein
    the first memory includes a first rectifying in a portion in contact with the second wiring and
    the second memory includes a second rectifying in a portion in contact with the second wiring.

14. The device according to claim 13, wherein
    the first rectifying has a first diode between the first memory and the second wiring, and
    the second rectifying has a second diode between the second memory and the second wiring.

15. The device according to claim 1, wherein the blocking portion suppresses carrier transport between the first portion and the second portion.

16. A non-volatile memory device comprising:
    a first wiring extending in a first direction;
    a second wiring extending in a second direction orthogonal to the first direction, and electrically connected to the first wiring;
    third wirings extending in a third direction orthogonal to the second direction, a pair of the third wirings being aligned in the second direction on both sides of the second wiring, and facing each other across the second wiring;

a first memory provided between one wiring included in the pair of the third wiring and the second wiring; and a second memory provided between another wiring included in the pair of the third wiring and the second wiring, and the second wiring having a first portion in contact with the first memory and a second portion in contact with the second memory, the first portion and the second portion containing semiconductor materials and an interface between the first portion and the second portion including a discontinuous surface of a semiconductor crystal.

* * * * *